United States Patent [19]

Choe et al.

[11] Patent Number: 5,068,884
[45] Date of Patent: Nov. 26, 1991

[54] X-RAY GENERATION SYSTEM FOR AN ULTRA FINE LITHOGRAPHY AND A METHOD THEREFOR

[75] Inventors: Young K. Choe; Jeon W. Yang; Jin H. Lee; Jae S. Lee, all of Daejeon-Si; Kyu H. Shim, Cheongju-Si; Jin Y. Kang, Daejeon-Si, all of Rep. of Korea

[73] Assignee: Electronics and Telecommunications Research Institute, Chungnam, Rep. of Korea

[21] Appl. No.: 459,244

[22] Filed: Dec. 29, 1989

[30] Foreign Application Priority Data

Dec. 30, 1988 [KR] Rep. of Korea ............... 88-17987

[51] Int. Cl.$^5$ ............................................. H01J 35/00
[52] U.S. Cl. .................................... 378/119; 378/122; 378/120
[58] Field of Search ............... 378/119, 123, 120, 125, 378/138, 139, 145, 122; 313/362.1, 231.41

[56] References Cited

U.S. PATENT DOCUMENTS 4,644,576  2/1987  Kuyel .............................. 373/362.1

4,841,556  6/1989  Kato et al. ........................ 378/119

FOREIGN PATENT DOCUMENTS 0108249  6/1984  Japan ............................... 378/119

Primary Examiner—Edward P. Westin
Assistant Examiner—Don Wong
Attorney, Agent, or Firm—Birch, Stewart, Kolasch & Birch

[57] ABSTRACT

An X-ray generation system for an ultra fine lithography includes a center electrode having an adjusting member, peripheral electrode having gas flow holes, a metal disc having gas flow holes for generating the X-ray from a plasma, a large capacitor, a transparent cylinder, a discharge member, Be discharge and observing windows, a cylindrical insulator, exhaust holes, a metal container, large electric power spatial gap switches, a current returning wire, an exhaust pump, and gas feeding members. Thereby, the system provides continuous operation and increased stability, controlling and discharging quantity so that the X-ray system can be easily utilized for researching and commercial applications.

11 Claims, 4 Drawing Sheets

FIG. 2

X-RAY GENERATION SYSTEM FOR AN ULTRA FINE LITHOGRAPHY AND A METHOD THEREFOR

BACKGROUND OF THE INVENTION

1. Field of the Invention

The present invention relates to an X-ray generation system for an ultra fine lithography and a method of using the system and more particularly, to an X-ray generator system for an ultra fine lithography which produces a soft X-ray for use in a semiconductor element by discharging gas at a high temperature and partially etching a semiconductor film.

2. Description of Related Art

Various types of X-ray generation systems for an ultra fine lithography are well known in the art. Electronic techniques have developed which provide a high integration and an ultra high speed. One of such X-ray generation system is shown in FIG. 1 having a high voltage discharging device for generating a soft X-ray with a high temperature gas. Generally, a high voltage over 10 KV is applied to coaxial cylindrical electrodes and a short ignition voltage is applied to a spatial pair of gap switch members. Thereby, an electric discharge is produced along the surface of an insulator 3 disposed between a center electrode 1 and a peripheral electrode 2.

At this time, a magnetic field of an azimuth angle direction is generated around the center electrode 1. The generated magnetic field pushes out the discharge current toward the centrifugal direction and the axial directions. The discharge current reaches the tip of the center electrode 1. Therefore, the discharge current generates an ionized gas, such as plasma gas, of a high temperature and a high density. The soft X-ray is emitted from the plasma gas at the high temperature and density mainly in the form of a bremsstrahlung.

Accordingly, such a type of apparatus has been mainly utilized either in a researching nuclear fusion test for the plasma, applied as a switch in electric power generation or in space. However, such an apparatus has never been utilized in the art of ultra fine lithography. The major reason which prevents the use of such an apparatus in ultra fine lithography is contamination within the interior of a discharge chamber 19 according to the electric discharge of a large current which instantaneously increases to several million amperes and a high voltage of about 10–90. An additional reason which prevents the use of such an apparatus is the fluctuation of a gas stream within the interior of the discharge chamber 19 generated in response to the high speed travel of current in spatial curved surfaces. Also, such an type apparatus is greatly affected by the current supply, a large impedance of a current returning wire and the impedance in the center axis direction of a large electric power switch

SUMMARY OF THE INVENTION

Accordingly, it is an object of the present invention to provide an X-ray generation system for an ultra fine lithography and a method of using the system.

Another object of the present invention is to provide an Xray generation system for ultra fine lithography which emits a soft X-ray by acceleration and ionized gas by collisions among the ultra fine lithography so as to produce a high integrated semiconductor element by utilizing the soft X-ray. As a result, the disadvantages of the generation point of the soft X-ray being unstable, the duration of the apparatus being weak, and the commercial applicability being difficult by causing severe contamination is overcome.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to an X-ray generation system for an ultra fine lithography which includes a center electrode having an adjusting member, a peripheral electrode having gas flow holes, a metal disc having gas flow holes for generating the X-ray from a plasma, a large capacitor, a transparent cylinder, a discharge member, Be discharge and observing windows, a cylindrical insulator, exhaust holes, a metal container, large electric power spatial gap switches, a current returning wire, an exhaust pump, and gas feeding members for continuously operating, increasing stability, controlling, and discharging the quantity so that the X-ray generation system can be easily utilized in researching and commercial applications.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 diagrammatically shows the soft X-ray generation system according to an embodiment of the present invention;

DESCRIPTION OF THE PREFERRED EMBODIMENTS

Figure 1:
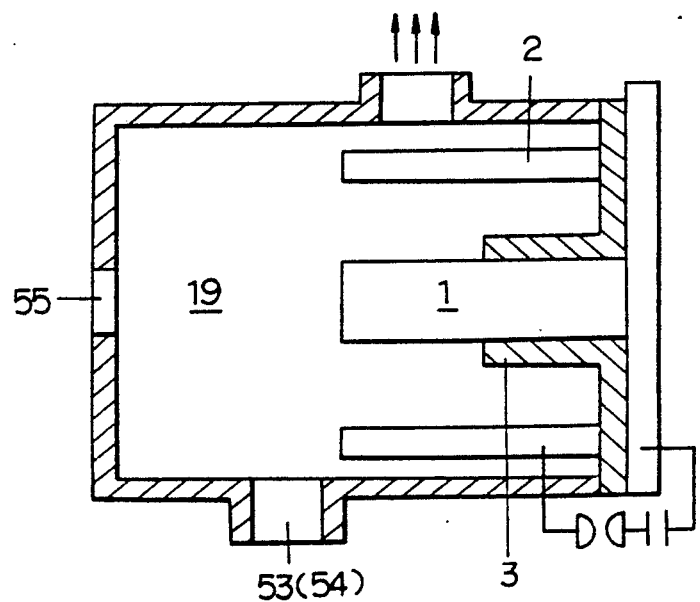
FIG. 1 diagrammatically shows a conventional X-ray generation system.
Figure 2:
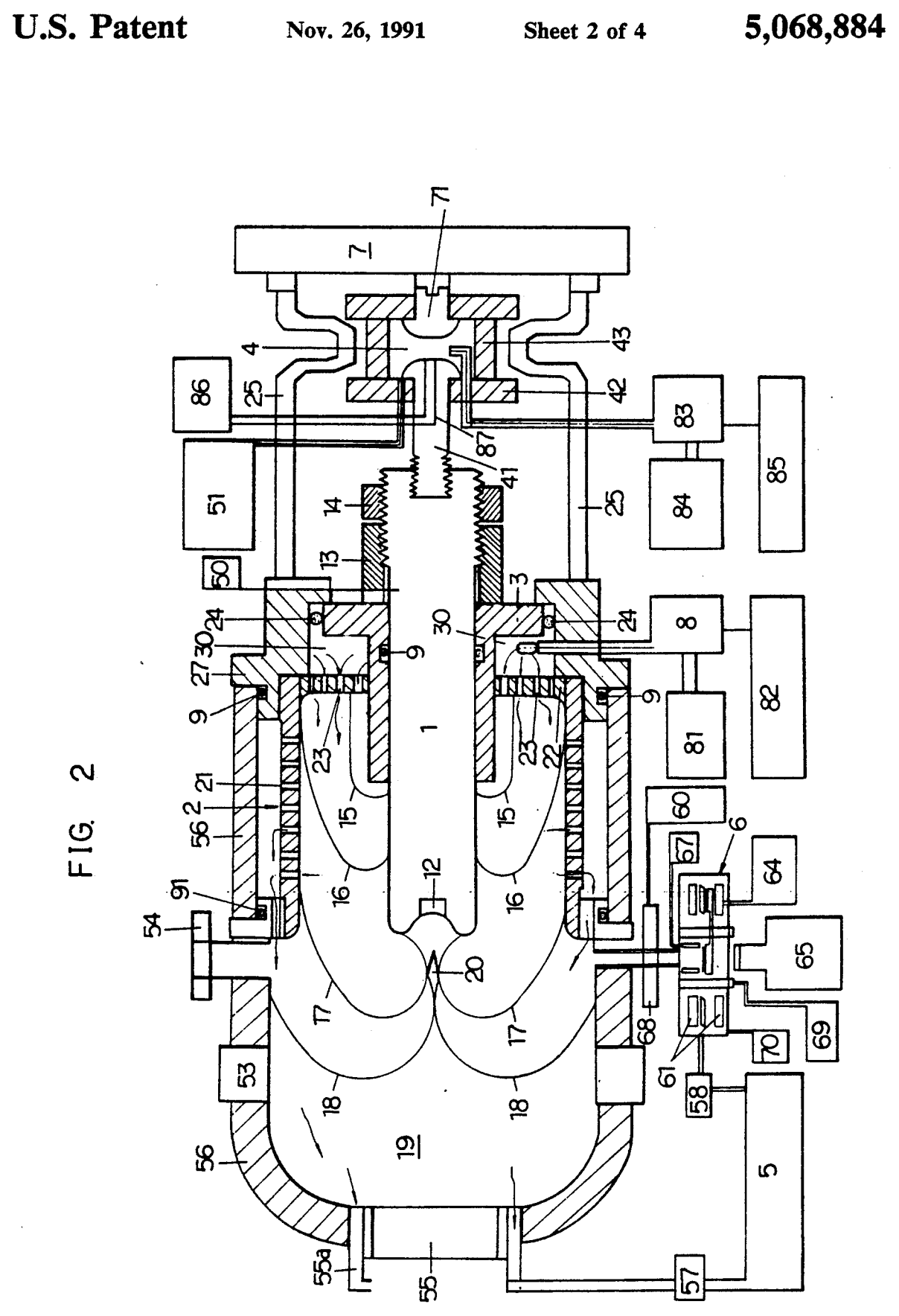

Referring now in detail to the drawings for the purpose of illustrating preferred embodiments of the present invention, the soft X-ray generation system as shown in FIG. 2 includes a metal disc 22 disposed between the insulator 3 and the peripheral electrode 2, a large electric power switch having switching metals 41 and 71 mounted on successively extending axial lines of the center electrode 1, a current returning wire 25 mounted to a switch discharging chamber 4 in almost a parallel direction to the axial direction, exhaust holes 55a provided axially in an annular arrangement, and an observation cylinder 56 having a plurality of observation windows 53, 54, and 55. The insulator is made of MC nylon.

The X-ray generation system further includes a discharge member of exposure 6 for removing contamination of a Be discharge window 6a disposed at a discharge opening 6b, and a gas feeding chamber 30 disposed between the metal disc 22 and the insulator 3 so that the gas is fed to the discharge chamber 19 if necessary.

Figure 3A:
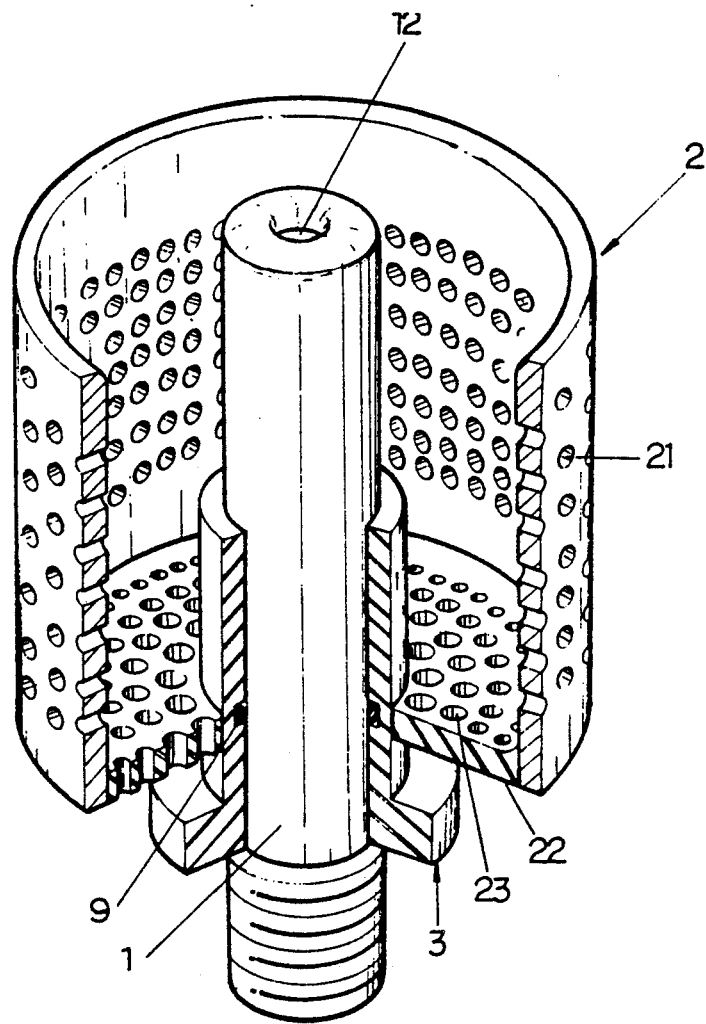
FIG. 3A is a perspective view of external electrodes according to an embodiment of the present invention containing cut away portions in order to illustrate the construction thereof.
Figure 3B:
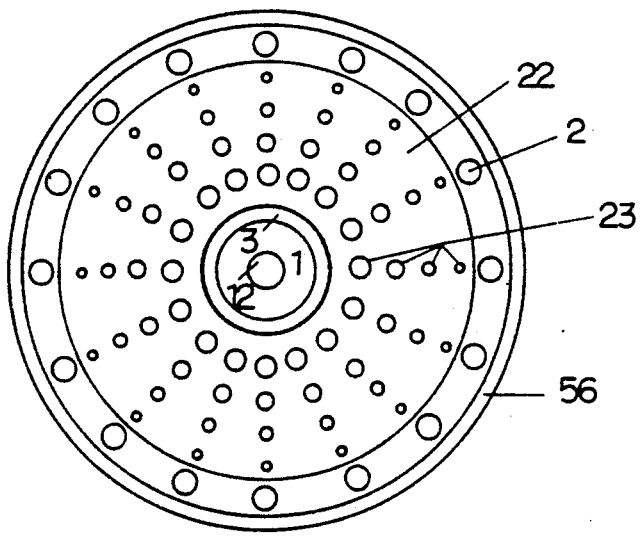
FIG. 3B is a top plan view of the external electrodes of FIG. 3A.

As shown in FIGS. 3A and 3B, the peripheral electrode 2 is either provided with a plurality of gas flow apertures 23 perforated in the metal disc 22 or in round metal bars (not shown). The plurality of apertures 23 of the metal disc 22 are gradually smaller from the center to the circumferential portion thereof and their directions are aligned with the peripheral electrode 2.

Major and auxiliary gas supplied from a first gas source 81 through a gas ionization chamber 8 and a gas pipe 87 is fed to the gas feeding chamber 30 and the gas passes through the metal disc 22 and the discharge chamber 19 in almost a parallel direction to the axis. Thereafter, the gas reaches an exhaust holes 55a and a valve 57. Thereafter, the gas reaches an exhaust pump 5.

The gas that is removed from the contamination in the discharge member 6 flows from a second gas source 70 and passes through the discharge member 6 and a valve 58. Thereafter, the gas reaches the exhaust pump 5.

Furthermore, another gas flows from a third gas source 84 and passes through a gas ionization chamber 83 and the switch discharge chamber 4. Thereafter, the gas is exhausted to an exhaust pump 51.

According to one embodiment of the present invention, the flow of the electric current is explained as follows:

Initially, the electric current flows from a large capacitor 7 and passes through a spatial gap disposed between the switching metal electrodes 41 and 71 in a plasma form having a high temperature and a high density from either an ignition voltage source 86 or an ionized gas;

Thereafter, the electric current reaches to the center electrode 1;

Subsequently, the electric current flows along the surface of the insulator 3 as a surface discharge, and gradually flows to either the peripheral electrode 2 or the metal disc 22 by passing along current spatial curved surfaces 15, 16, 17, and 18, and by passing through a fixed electrode annular base 27 and the current returning wire 25;

Thereafter, the electric current returns to the capacitor 7.

The soft X-ray generated from a generating point 20 in a form of a blemsstrahlung according to the mutual collision of the discharging current reaches the tip of the center electrode 1, and is emitted toward the centrifugal direction.

The soft X-ray directed to the discharge opening 6b of the discharge member 6 passes through the Be discharge window 6a and reaches the mask mounted to a wafer supporting base 65 and a resist film of the wafer surface.

According to the present invention, various advantages of the X-ray, generation system are explained as follows:

First, the lighting point of the X-ray generation system has stability. That is, the gas conductivity is controlled by the size of the gas flow apertures 23 of the metal disc 22 between the gas feeding chamber 30 and the discharge chamber 19 so that a differential vacuum is formed between two chambers 30 and 19 and a uniform flow results;

Additionally, the size of the gas flow apertures 23 of the metal disc 22 gradually increases toward the center portion of the metal disc 22 so that the gas flow can uniformly fill the rear portion of the current spatial curved surfaces 15, 16, 17, and 18. Thereby, the gas fluctuation can be reduced.

Also, a container from a tip of the center electrode 1 to the exhaust holes 55a of an observation cylinder 56 has a semi-circular configuration. Thereby, the distortion of potential distribution is prevented in addition to the gas flow and the reproducibility of the generation point 20 can be improved.

Furthermore, the plurality of gas flow apertures 23 are symmetrically formed so as to uniformly generate an initial discharge for the entire metal disc 22. In order to reduce the gas fluctuation from the surplus gas that is pushed along with the current spatial curved surfaces 15, 16, 17, and 18, the stability and reproducibility of the discharge are enhanced by either perforating gas flow apertures 21 to the peripheral electrode 2 or the metal bars.

Also, the X-ray generation system has contamination removal capacity. That is, in order to prevent deterioration in the function of the insulator 3 from contamination during the operation, a removing electric power source 50 operates for a predetermined interval so that the contamination is eliminated by the ion collision effect.

Figure 4:
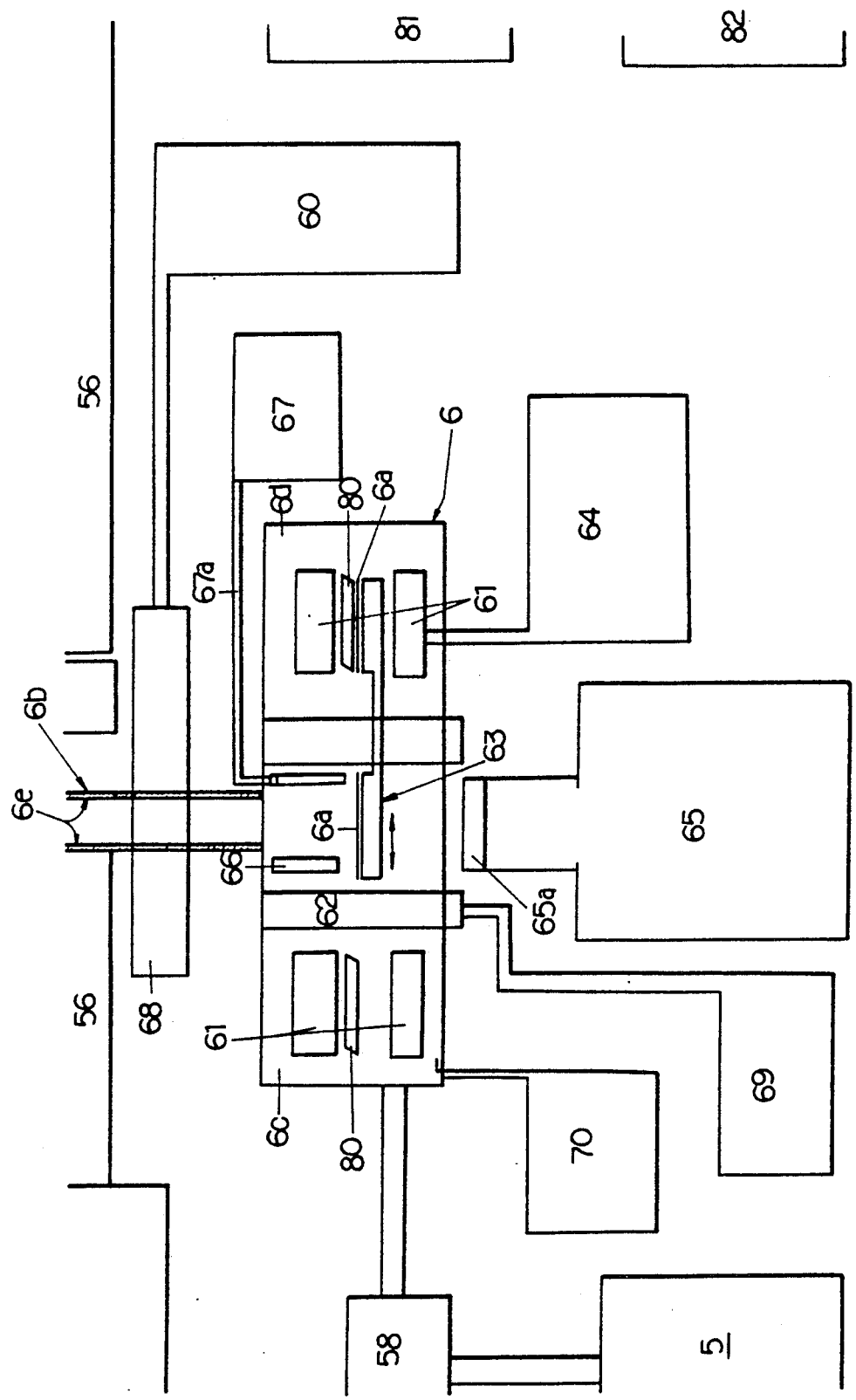
FIG. 4 is a magnified fragmentary diagram of an X-ray emitting member according to an embodiment of the present invention.

At the same time, after eliminating the contamination of the Be discharge window 6a by either an electric method according to the ion collision or a rotary track-shaped teeth of a comb due to the contamination of the discharge member 6 of exposure, the Be discharge windows 6a are alternately used so that the X-ray generator system can be almost continuously operated (FIG. 4).

This is possible by forming electrodes 61 and 66, vacuum chambers 6c and 6d, vacuum isolation valve 62 and a valve and 68, a permeable window supporting base 63, a gas source 70, power sources 64, 67 and 69 to the exposing discharge member 6, and an independent exhaust outlet 59 in a vacuum state. Reflector mirrors 6e are mounted to the interior of the discharge opening 6b and the soft X-ray diverges toward the centrifugal direction and is converted to the wafer thereby enhancing the energy efficiency.

Third, when the current returning wire 25 passes between switching metals 41 and 71 of two electrodes of the switch discharge chamber 4, the radius is reduced to a minimum and the impedance of the switch discharge chamber 4 and the discharge chamber 19 are reduced so that the flow speed is fast. Also, a large amount of energy can be supplied to a generating point, such as the discharge chamber 19.

Fourth, the active process of the discharge can be measured and observed by providing the transparent observation cylinder 56 and three dimensional observation windows 53, 54, and 55. Thereby the discharging state can be measured and controlled. The discharge starting voltage can be controlled by previously feeding the ionized gas to the discharge chamber 19 and the switch discharge chamber 4 while maintaining the vacuum by applying only vacuum sealing rubber rings 9, 24, and 91. The length of the center electrode 1 can be simultaneously controlled by an adjusting screw 13 and a tightening screw 14.

Accordingly, the present invention has many advantages where the continuous operation is possible by increasing the stability of the lighting point and removing contamination periodically. The amount of rays is increased by controlling the impedance ratio and the entire discharge can be controlled by a three dimensional observation.

Thus, the utilization of this method an apparatus in research and commercial applications are easier than the conventional methods or apparatus applications.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A soft X-ray generator system for an ultra fine lithography comprising:
   a length adjustable center electrode having an adjusting screw and a tightening screw for adjusting the length of said center electrode;
   a cylindrical peripheral electrode surrounding said ceer electrode and having a plurality of gas flow apertures or electrode bars for generating a soft X-ray from an ionized gas at a high temperature;
   a transparent observation cylinder attached to said peripheral electrode of observing the X-ray generator system from the outside of said cylindrical peripheral electrode;
   a discharging member or exposure connected to said cylindrical peripheral electrode for perpendicularly discharging said center electrode;
   a plurality of vacuum sealing rubber rings disposed between said center and said cylindrical peripheral electrodes having Be discharge and observation windows for maintaining vacuum of a vacuum chamber, wherein said observation windows observe and measure three dimensionally;
   a cylindrical insulator surrounding said center electrode having a base;
   a metal container connected to said peripheral electrode having a tip of said center electrode extending to exhaust holes of a semi-circular, a circular, or an oval observation cylinder, wherein said exhaust holes are provided symmetrically and axially in a circular arrangement at opposite sides of insulators and an exhaust pump;
   a pair of spatial gap switching metal electrodes having a large electric power and a capacitor connected to said center electrode respectively,
   circular current returning wires having a diameter of a circular connecting each of said returning wires at a minimum when said current returning wires pass between two electrodes of a switch discharge chamber;
   a separate electric power source connected to said discharge member for removing contamination between a center cylinder and said peripheral electrode;
   a metal disc having a plurality of apertures disposed between a discharge chamber and said cylindrical insulator; and
   gas feeding members connected to said discharge chamber for feeding the ionized gas to said discharge chamber.

2. The soft X-ray generator system of claim 1, wherein a peripheral edge o he tip of the center electrode has a circular configuration and a center portion of the electrode has an indentation.

3. The soft X-ray generator system of claim 1, wherein the insulator comprises nylon and includes a quarter circle disposed at one end thereof.

4. The soft X-ray generator system of claim 1, wherein the plurality of gas flow apertures of the metal disc gradually increase in size toward the center portion of the metal disc in a circularly radial line, wherein the lines of the apertures are arranged in the centrifugal direction to form one line of an electrode bar.

5. The soft X-ray generator system of claim 4, wherein at least eight apertures are disposed in the center portion of the metal disc, said apertures are vertically straight and slightly slanted.

6. The soft X-ray generator system of claim 1, wherein the discharging member comprises reflector mirrors attached o the interior of a discharge opening, a vacuum isolation valve disposed within the discharge member, a pair of independent vacuum chambers disposed at the nd of said discharge opening, a valve disposed between said discharge opening and said vacuum chambers, a permeable window supporting base for moving linearly between said pair of vacuum chambers and said discharge opening, a cylindrical electrode vain he same diameter as the Be discharge window being disposed between at the vacuum isolation alve and the Be discharge window, and electric power sources for the vacuum chamber.

7. The soft X-ray generator system of claim 6, wherein each independent vacuum chamber comprises a pair of disc -electrodes, a gas inlet, an outlet, a connecting member of the electric power sources for removing contamination, and a rotary track-shaped teeth of a comb.

8. The soft X-ray generator system of claim 1, wherein an ionizing member of said independent vacuum chambers is an electric power source selected from the group consisting of a direct current, an alternating current, and an ultra high frequency wave which is added with a magnetic field effect.

9. A method for developing a soft X-ray in an ultra fine , lithography X-ray genrator system comprising the steps of:
   adjusting the length of a center electrode by an adjusting screw and a tightening screw;
   generating a soft X-ray from an ionized gas at a high temperature from a peripheral electrode surrounding said center electrode and having a plurality of gas flow apertures or electrode bars;
   perpendicularly discharging said center electrode by an exposing discharge member;
   maintaining vacuum of a vacuum chamber by a plurality of vacuum sealing rubber rings and Be discharge and observation windows;
   removing contamination between said peripheral electrode and a center cylinder by an electric power source connected to said discharge member; and
   feeding ionized gas to said discharge member by gas feeding members.

10. The method of claim 9, wherein the ionized gas is repeatedly fed periodically for short periods of time or for a predetermined time before ignition of the X-ray generator system.

11. The method of claim 9, wherein said steps of removing contamination comprises an electric power switch, an insulated vacuum container, a pair of semi-spherical electrodes, a gas inlet, an outlet, a second center electrode and an ignition electrode insulated within the interior of a connection electrode.

* * * * *